United States Patent
Dou

(10) Patent No.: US 8,896,195 B2
(45) Date of Patent: Nov. 25, 2014

(54) FILAMENT FOR ELECTRON SOURCE

(75) Inventor: Juying Dou, San Jose, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 92 days.

(21) Appl. No.: 12/909,745

(22) Filed: Oct. 21, 2010

(65) Prior Publication Data

US 2012/0098409 A1   Apr. 26, 2012

(51) Int. Cl.
*H01J 1/15*  (2006.01)
*H01J 19/08* (2006.01)
*H01K 1/02*  (2006.01)
*H01J 37/065* (2006.01)

(52) U.S. Cl.
CPC .......... *H01J 1/15* (2013.01); *H01J 37/065* (2013.01); *H01J 2237/06316* (2013.01); *H01J 2237/061* (2013.01); *H01J 2237/0216* (2013.01)
USPC ............ 313/341; 313/310; 313/326; 313/345

(58) Field of Classification Search
USPC ......... 313/414, 441–460, 495–497, 293–304, 313/306, 309–310, 346, 351, 355, 341, 313/346 R, 336, 326; 438/20
See application file for complete search history.

(56) References Cited

U.S. PATENT DOCUMENTS

| | | | | |
|---|---|---|---|---|
| 3,631,291 A * | 12/1971 | Favreau | | 313/345 |
| 4,055,780 A * | 10/1977 | Kawai et al. | | 313/346 R |
| 5,838,096 A * | 11/1998 | Shinada et al. | | 313/336 |
| 6,188,167 B1 * | 2/2001 | Endo et al. | | 313/309 |
| 8,227,764 B2 * | 7/2012 | Mannino et al. | | 250/423 F |
| 2002/0021083 A1* | 2/2002 | Hasegawa et al. | | 313/495 |
| 2005/0001220 A1* | 1/2005 | Magera et al. | | 257/79 |
| 2006/0076866 A1* | 4/2006 | Terui et al. | | 313/309 |
| 2009/0032724 A1* | 2/2009 | Lozano et al. | | 250/398 |
| 2010/0019649 A1* | 1/2010 | Terui et al. | | 313/446 |
| 2010/0090581 A1 | 4/2010 | Terui et al. | | |
| 2010/0237762 A1* | 9/2010 | Nonogaki et al. | | 313/310 |

* cited by examiner

*Primary Examiner* — Donald Raleigh

(74) *Attorney, Agent, or Firm* — WPAT, PC; Justin King

(57) ABSTRACT

This invention relates to a filament for electron emission cathode which is employed in an electron microscope, a critical dimension examine tool, an electron beam lithograph machine, an electron beam tester and other electron beam related systems as an electron source. Embodiments of the present invention discloses method with which a Re (Rhenium) is used as heat source such that vibration issue of prior tungsten filament can be depressed.

17 Claims, 4 Drawing Sheets

400

FILAMENT FOR ELECTRON SOURCE

BACKGROUND OF THE INVENTION

1. Field of the Invention

The present invention relates to a filament for electron source, and more particularly to a Schottky electron emission source.

2. Description of Related Art

Electron sources are applied to devices such as electron beam lithography systems, electron microscopes, Auger electron spectrometers, and semiconductor inspection systems. In such devices, an electron source provides electrons, which are then guided into an intense, finely focused beam of electrons having energies within a narrow range. To facilitate formation of such a beam, the electron source should emit a large number of electrons within a narrow energy band. The electrons should be emitted from a small surface area on the source into a narrow cone of emission. Electron sources can be characterized by brightness, which is defined as the electron current divided by the real or virtual product of the emission area and the solid angle through which the electrons are emitted.

Electrons are normally prevented from leaving the atoms at the surface of an object by an energy barrier. The amount of energy required to overcome the energy barrier is known as work function of the surface. A thermionic emission electron source relies primarily on heat to provide the energy to overcome the energy barrier and emit electrons. Thermionic emission sources are not sufficiently bright for use in many applications.

Another type of electron source, a cold field emission electron source, operates at room temperature and relies on a strong electric field to facilitate the emission of electrons by tunneling through the energy barrier. A field electron source typically includes a narrow tip at which electrons leave the surface and are ejected into surrounding vacuum. Since a cold field emission electron source is operated at room temperature, it thus has low chromatic aberration and is used as electron source for high-resolution electron beam device. Also, since cold field emission electron sources are operated at room temperature, gas tends to adsorb to the electron emission surface. Therefore, cold field emission sources exhibit instabilities that cause problems in many applications.

Yet another type of electron source is referred to as a Schottky electron emission source or Schottky emitter. Schottky emitters use a coating on a heated emitter tip to reduce its work function. In Schottky emission mode, Schottky emitter uses a combination of heat and electric field to emit electrons, which appears to radiate from a virtual point source within the tip. With changes to the emitter temperature and electric field, the Schottky emitter will emit in other emission modes or combinations of emissions mode. Schottky emitters are very bright, and are more stable and easier to handle than cold field emitters. Because of their performance and reliability benefits, Schottky emitters have become a common electron source for modern electron beam systems.

As shown in FIG. 1, a typical Schottky electron emission source 100 is provided, which includes an emitter 101 having an apex 108 from which the electrons are emitted, a coating 102 on the emitter 101, a tungsten filament 103 for supporting the emitter 101, two electrodes 104 for mounting the filament 103, and a base 105 for supporting the two electrodes 104. The tungsten filament 103 is a bended wire and heated for providing heat to the emitter 101. Schottky electron emission source 100 typically operates with apex 108 at a temperature of approximately 1800K. Emitter 101 is typically made from a single crystal of tungsten oriented in the <100>, <110>, <111>, or <310> orientation. Emitter 101 is coated with a coating material to lower its work function. Such coating materials could include, for example, compounds, such as oxide, nitrides, and carbon compound, of zirconium, titanium, hafnium, yttrium, niobium, vanadium, thorium, scandium, beryllium, or lanthanum. For example, coating a (100) surface of tungsten with zirconium and oxygen lowers the work function of the surface from 4.5 eV to 2.8 eV. By reducing the energy required to emit electrons, the coating on the emitter makes it a brighter electron source.

Conventional thin (0.005 inch=0.127 mm) tungsten filament is used for electron source. However, this structure, thin tungsten filament 103, will induce vibration issue, and this issue can also be referred to U.S. Patent Publication No. 2010/0090581. A simple way to depress the vibration issue is to thicken tungsten filament directly. Nevertheless, the tungsten filament 103 cannot be thickened directly, because low resistance of tungsten will incur higher operation current larger than 3 A(ampere). Power supply can hardly provide such a large current for electric circuit of the electron source 100.

Two companies, KIMBALL PHYSICS and DENKA, provide a ribbon-type tungsten filament 203 used for electron source 200 to resolve the vibration issue, as shown in FIG. 2. Although this ribbon-type structure may inhibit the vibration issue, it will make the tungsten filament 203 not easily be welded to electrodes 204, because the ribbon-type filament 203 with a certain width-to-thickness ratio will cause welding issue while small side of the ribbon-type filament 203 welds on the electrodes 204.

Another solution is provided by DENKA, as shown in FIG. 3 and also referred to U.S. Patent Publication No. 2010/0090581. A cup-shaped component (6) is added to support the tip (1), and a tungsten filament (3) is used to heat up the cup-shaped component (6). Thus, the vibration issue is also resolved. However, cup-shaped tungsten component with tungsten filament assembly has complex structure (each component is very tiny, about 0.1-0.01 mm), and no commercial product available now. Further, the cup-shaped component (6) is heated up indirectly by the tungsten filament (3), i.e., not electrothermal means to heat up the cup-shaped component (6). Such a heating process has lower thermal efficiency, and will incur more power consumption to achieve the same performance Accordingly, a new filament should be provided not only to solve the vibration issue, but also to keep all advantages that conventional tungsten filament possesses.

SUMMARY OF THE INVENTION

In one embodiment, an electron source is disclosed by using a rhenium filament, such that a thicker filament can be provided to prevent from vibration issues.

Accordingly, a filament for an electron source is provided, which comprises a rhenium wire with a diameter equal to or larger than 0.006 inch. The rhenium wire is bended such that two ends thereof are welded. A central portion of the rhenium wire is convex to the two ends such that a tip of the electron source can mount to the central portion of the rhenium wire. The two ends of the rhenium wire are welded to two electrodes respectively. A bended angle of the rhenium wire is between 10 to 100 degree.

This invention further provides a filament for an electron source, which comprises a tungsten wire with a diameter larger than 0.005 inch with a bended angle larger than 60 degree.

An electron source is also provided, which comprises a base, two electrodes embedded into the base and distanced apart with each other, a rhenium wire with a diameter equal to or larger than 0.006 inch, and an emitter mounting on the central portion of the rhenium wire. The rhenium wire is bended such that two ends thereof are welded to the two electrodes, and central portion of the rhenium wire is convex to the two ends.

This invention further provides an electron source, which comprises a base, two electrodes embedded into said base and distanced apart with each other, a tungsten wire with a diameter equal to or larger than 0.005 inch, and an emitter mounting on the central portion of the tungsten wire. The tungsten wire is bended at angle larger than 60 degree such that two ends thereof are welded to said two electrodes, central portion of the tungsten wire being convex to the two ends.

The electron source further comprises a coating on the emitter, wherein the coating is metal oxide. Material of the metal is zirconium, titanium, hafnium, scandium, yttrium, lanthanide series element, barium, strontium, or calcium. Material of the base is ceramic, and material of the two electrodes is kovar.

Other advantages of the present invention will become apparent from the following description taken in conjunction with the accompanying drawings wherein are set forth, by way of illustration and example, certain embodiments of the present invention.

DETAILED DESCRIPTION OF EXAMPLE EMBODIMENTS

Figure 1:
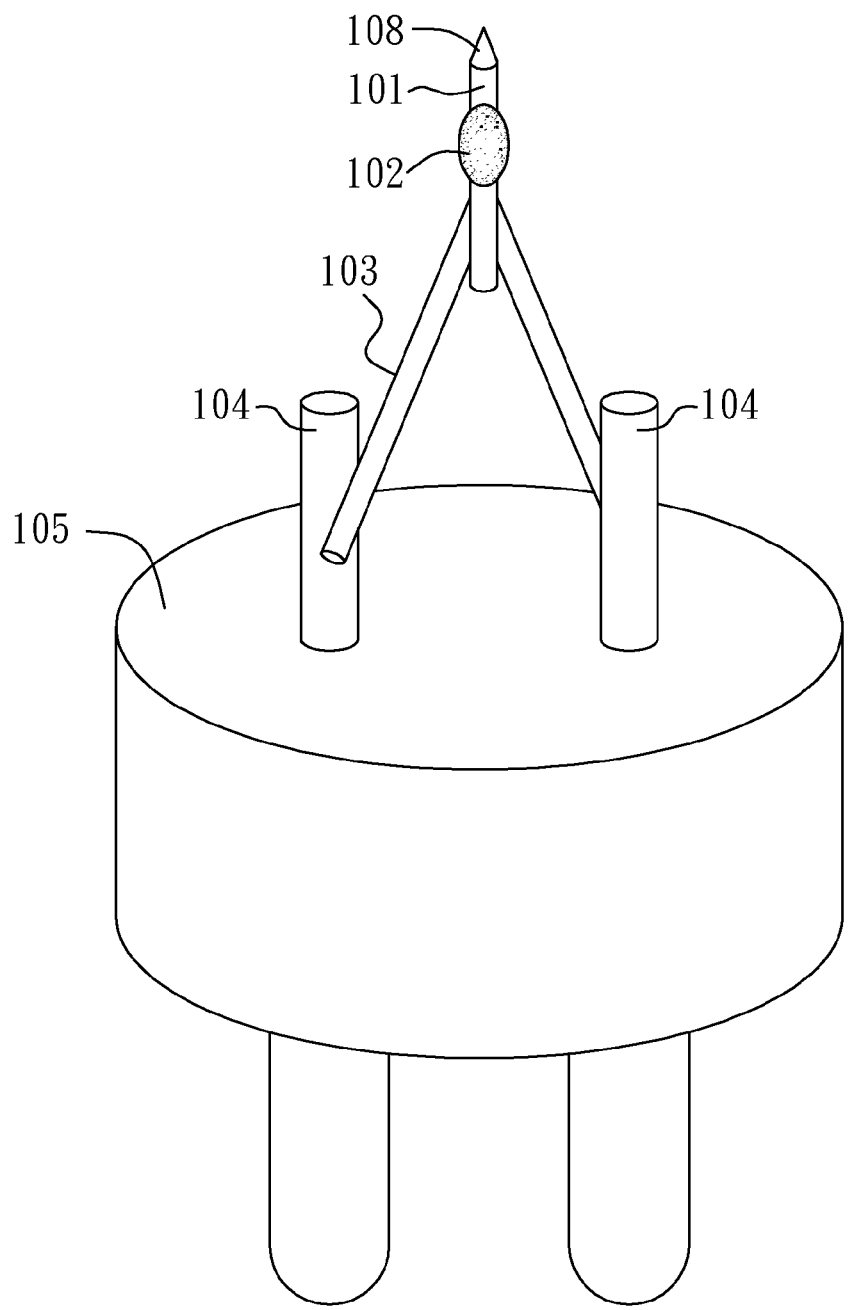
FIG. 1 is a schematic illustration of a conventional electron source with a tungsten filament that a vibration issue is occurred.
Figure 2:
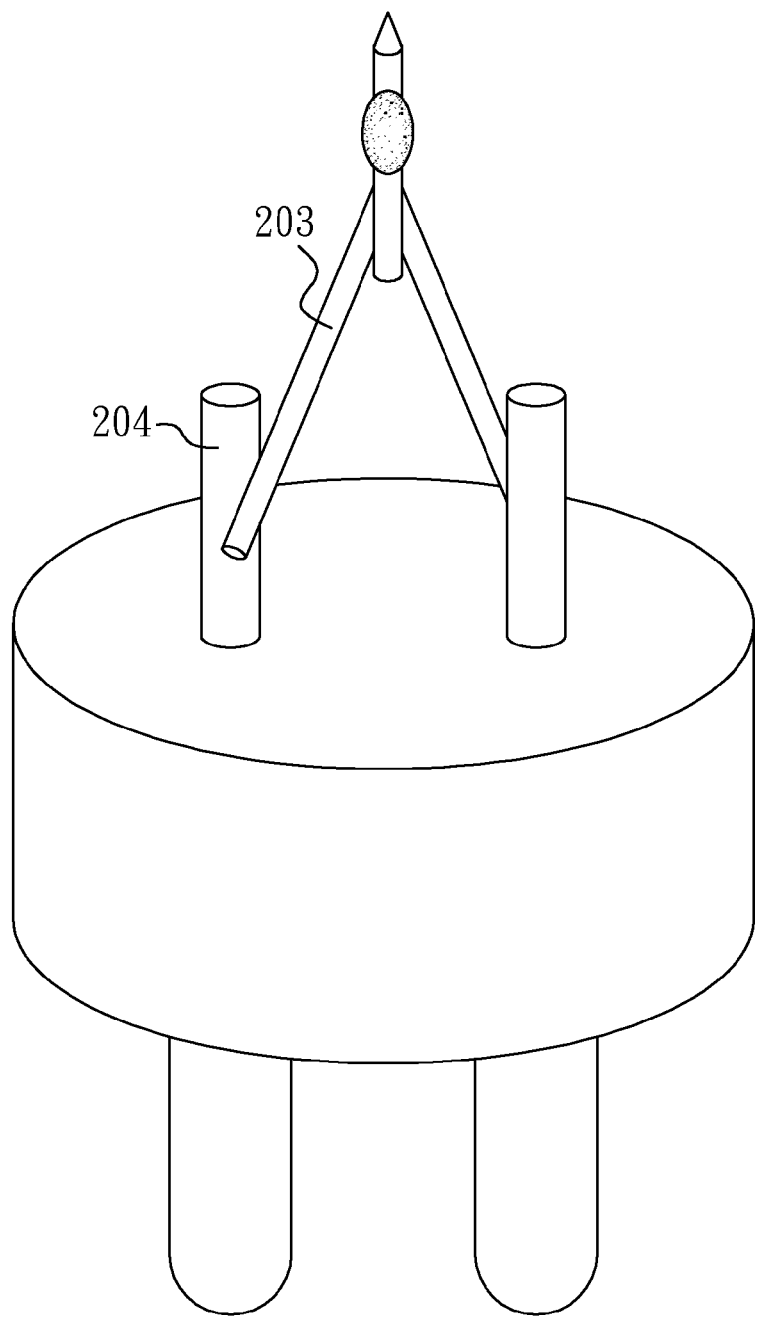
FIG. 2 is a schematic illustration of a conventional electron source designed by KIMBALL PHYSICS or DENKA to solve the vibration issue.
Figure 3:
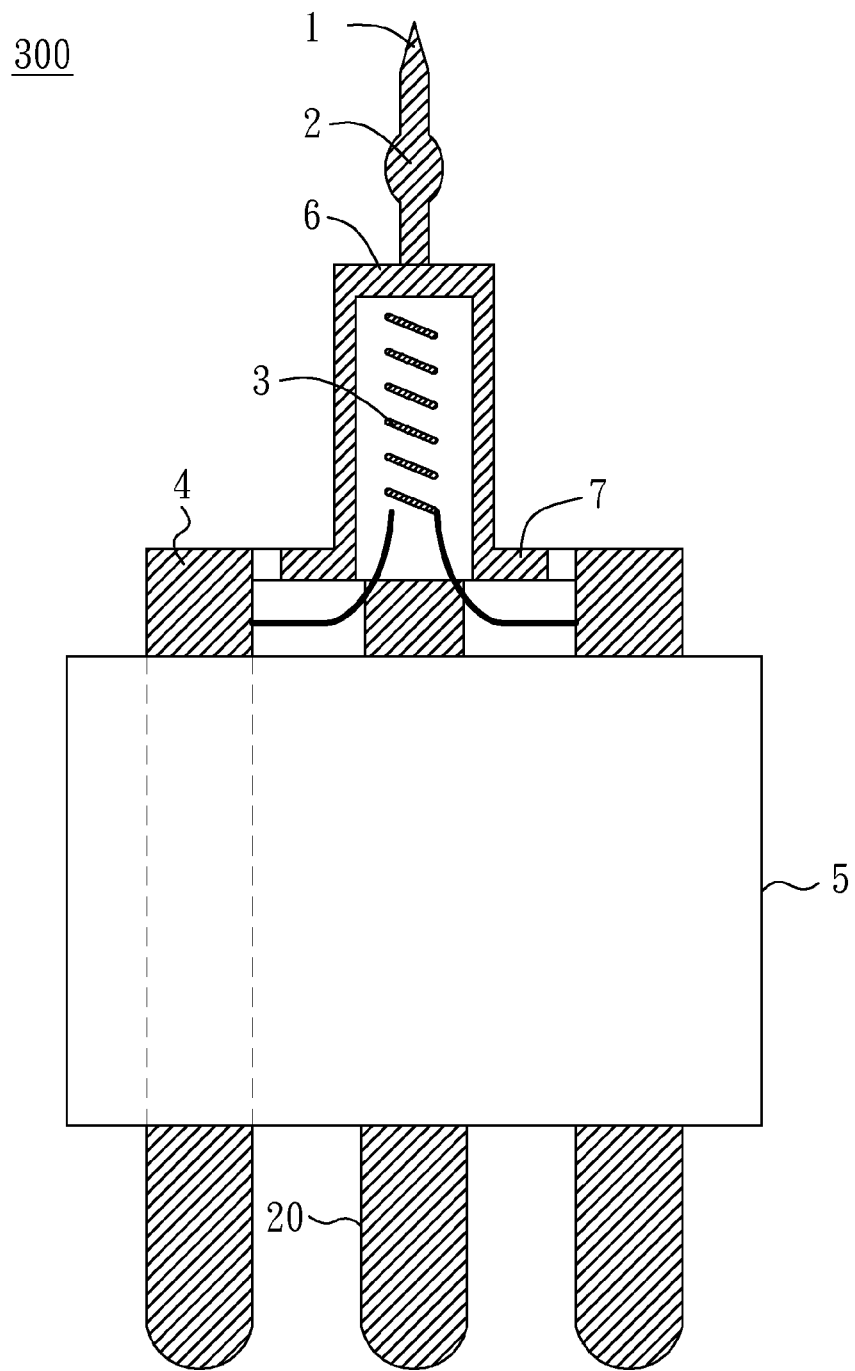
FIG. 3 is a schematic illustration of another conventional electron source designed by DENKA with a cup-shaped element to solve the vibration issue.

Various example embodiments of the present invention will now be described more fully with reference to the accompanying drawings in which some example embodiments of the invention are shown. In the drawings, the size of every component may be exaggerated for clarity.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Electron source is an important component for e-beam apparatus, in which the e-beam apparatus can be applied to SEM (scanning electron microscope), TEM (transmission electron microscope), or E-beam writer. Conventional thermal field emitter, cold field emitter, or Schottky emitter can be applied to the variant fields.

Figure 4:
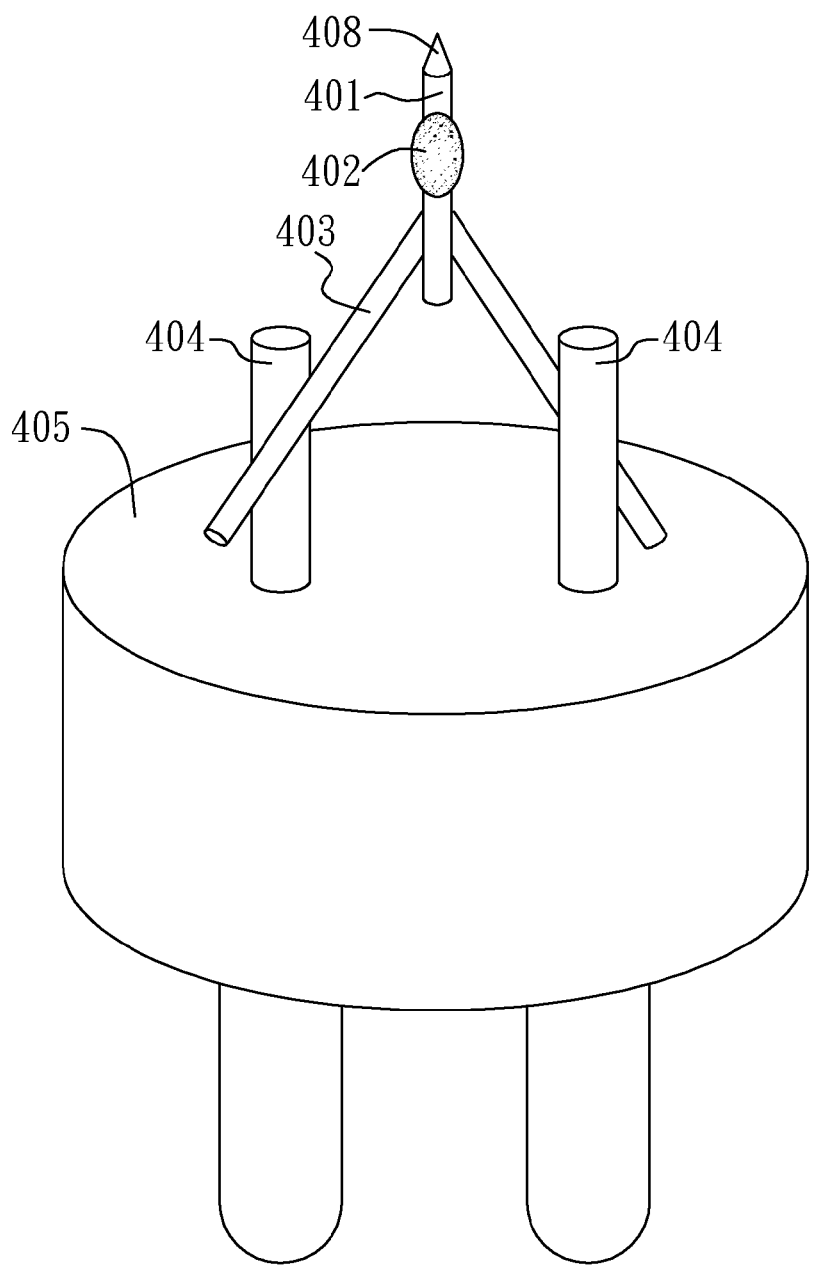
FIG. 4 is a schematic illustration of an electron source with a rhenium filament in accordance with an embodiment of the present invention.

Referring to FIG. 4, a new electron source 400 is provided with an emitter 401 mounted on a rhenium filament 403, in which a coating 402 is formed on the emitter 401 having an apex 408 from which the electrons are emitted. The rhenium filament 403 is mounted on two electrodes 404, and a base 405 supports the two electrodes 404.

Because rhenium has a higher resistivity, about 193 nΩ·m at 20° C., the rhenium filament 403 can be thicker than prior tungsten filament. The rhenium filament 403 has a dimension equal to or larger than 0.006 inch (or 6 mil) in diameter in one embodiment, and can be 0.006, 0.007, 0.008 or 0.009 inch. Larger thickness filament 403 can not only vibrate less, but also be more easily welded to the two electrodes 404.

The rhenium filament 403 is formed by using a rhenium wire, and then the rhenium wire is bended such that two ends can be welded to two electrodes 404 of the electron source 400. The central portion of the rhenium wire is convex to the two ends such that the emitter 401 can be mounted to the central portion of the rhenium filament 403. The bended angle of the rhenium filament 403 can range from 10 to 100 degree.

Material of the emitter 401 can be tungsten, molybdenum, iridium, niobium, tantalum, or rhenium. Coating 402 on the emitter 401 can be metal oxide, in which metal can be zirconium, titanium, hafnium, scandium, yttrium, lanthanide series element, barium, strontium, and calcium.

Besides a thermionic emission tip and a Schottky emission structure, a cold field emission tip (single-crystal or monocrystalline tungsten) can also be applied to this invention for flash a period.

The supporting base 405, material of which is insulator, can be ceramic or thermal ceramic, like oxide, nitride, or carbide, and specific material of the base 405 can be $Al_2O_3$, $ZrO_2$, or AlN.

Two electrodes 404, are conductive terminals, material of which can be Kovar (trademark of Carpenter Technology Corporation), which is a nickel-cobalt ferrous alloy designed to be compatible with the thermal expansion characteristics of borosilicate glass (~5×10$^{-6}$/K between 30 and 200° C., to ~10×10$^{-6}$/K at 800° C.) in order to allow direct mechanical connections over a range of temperatures. The name Kovar is often used as a general term for Fe—Ni alloys with these particular thermal expansion properties.

Table 1 is a simulation result of resonance frequency to different filament materials and shapes with different thickness. Conventional resonant frequency is between 2000 to 2500 Hz, and simulated result is 2381.6 Hz. Resonant frequency of ribbon-type tungsten is increased larger than 4000 Hz. High resonant frequency means that filament will be inhibited to vibrate; i.e., filament will more hardly vibrate at such high frequency. A suggested thickness of rhenium wire is equal to or larger than 0.006 inch, and preferred between 0.007 to 0.008 inch.

Furthermore, bended angle of a rhenium wire is another factor to resonant frequency except using thickened rhenium wire instead of tungsten wire. The resonant frequency of the rhenium wire is increased while bended angle of the rhenium wire is increased. Please refer to Table 1 again, when bended angle of rhenium wire with 0.009 inch in diameter is varied from 60 to 70 degree, resonant frequency can be increased from 5114.7 to 6826.2 Hz significantly. It should be noted that numbers within parentheses in Table 1, that are simulated for tungsten wire with different bended angle, denote not easy to practice compared to the use of rhenium wire. However, they provide interesting information that even tungsten wire with a larger bended angle can have higher resonant frequency; i.e., the vibration issue can either be suppressed to some extent, although suppressed range is limited. If structure of the electron source can suppress vibration with 0.005 inch tungsten wire bended at 70 degree, or effect of vibration is acceptable, tungsten wire can be also applied to the electron source. Moreover, if a power supply can provide high current for the tungsten wire, a thickened tungsten wire, for example 0.006 inch, with a bended angle of 70 degree can also be applied to the electron source too. From another point of view, rhenium filament can be not only thickened, but also enlarged bended angle to suppress vibration issue. However, if the vibration issue is crucial to the electron source, rhenium filament would be a preferred design.

TABLE 1

| Shape | Thickness (inch) | Width (inch) | Frequency of Tungsten Ribbon (Bend angle 60°) (Hz) |
|---|---|---|---|
| Ribbon | 0.003 | 0.009 | 4626.9 |
| Ribbon | 0.003 | 0.008 | 4020.2 |
| Ribbon | 0.003 | 0.007 | 3536.5 |

| Shape | Diameter (inch) | Frequency of Tungsten Filament (Bend angle 60°) (Hz) | Frequency of Rhenium Filament (Bend angle 60°) (Hz) | Frequency of Tungsten Filament (Bend angle 70°) (Hz) | Frequency of Rhenium Filament (Bend angle 70°) (Hz) |
|---|---|---|---|---|---|
| Wire | 0.009 | (4935.2) | 5114.7 | (6592.1) | 6828.2 |
| Wire | 0.008 | (4337.4) | 4502.5 | (5784.2) | 6010.9 |
| Wire | 0.007 | (3712.8) | 3862.7 | (4941.0) | 5140.9 |
| Wire | 0.006 | (3035.5) | 3167.6 | (4011.5) | 4192.5 |
| Wire | 0.005 | 2381.6 | 2495.5 | 3123.9 | 3280.0 |

In this invention, thickened rhenium filament may depress the vibration issue in the electron source, and easily be welded to the two electrodes. Moreover, wider bended angle of the rhenium wire can further increase resonant frequency more significantly. Furthermore, structure of this filament is much simpler than the design by KIMBALL PHYSICS or DENKA, and the rhenium filament is heated directly by electrothermal electrode.

Although the present invention has been explained in relation to its preferred embodiment, it is to be understood that other modifications and variation can be made without departing from the spirit and scope of the invention as hereafter claimed.

What is claimed is:

1. A filament for a Schottky electron emission source, comprising: a rhenium wire with a constant diameter equal to or larger than 0.006 inch and less than 0.01 inch.

2. The filament for the Schottky electron emission source according to claim 1, wherein the rhenium wire is bended such that two ends thereof are welded.

3. The filament for the Schottky electron emission source according to claim 2, wherein a central portion of the rhenium wire is convex to the two ends such that an emitter of the electron source can mount to the central portion of the rhenium wire.

4. The filament for the Schottky electron emission source according to claim 3, wherein the two ends of the rhenium wire are welded to two electrodes respectively.

5. The filament for the Schottky electron emission source according to claim 2, wherein a bended angle of the rhenium wire is between 10 to 100 degree.

6. A Schottky electron emission source, comprising:
a base;
two electrodes embedded into said base and distanced apart with each other;
a rhenium wire with a constant diameter equal to or larger than 0.006 inch, being bended such that two ends thereof are welded to said two electrodes, central portion of the rhenium wire being convex to the two ends;
an emitter mounting on the central portion of the rhenium wire; and
a coating on a tip, wherein the coating is metal oxide.

7. The Schottky electron emission source of claim 6, material of the metal is zirconium, titanium, hafnium, scandium, yttrium, lanthanoid series element, barium, strontium, or calcium.

8. The Schottky electron emission source of claim 7, wherein the emitter is single crystal tungsten for Schottky electron emission.

9. The Schottky electron emission source of claim 6, wherein the emitter is single crystal tungsten for cold or thermionic electron emission.

10. The Schottky electron emission source of claim 6, wherein material of the base is ceramic.

11. The Schottky electron emission source of claim 6, wherein material of the two electrodes is kovar.

12. A filament for a Schottky electron emission source, comprising:
a tungsten wire with a constant diameter larger than 0.005 inch with a bended angle larger than 60 degree to depress vibration of the filament.

13. A Schottky electron emission source, comprising:
a base;
two electrodes embedded into said base and distanced apart with each other;
a tungsten wire with a constant diameter equal to or larger than 0.005 inch, being bended at an angle larger than 60 degree to depress vibration of the filament such that two ends thereof are welded to said two electrodes, central portion of the tungsten wire being convex to the two ends; and
an emitter mounting on the central portion of the tungsten wire.

14. The Sckottky electron emission source of claim 13, further comprising a coating on a tip, wherein the coating is metal oxide.

15. The Schottky electron emission source of claim 14, material of the metal is zirconium, titanium, hafnium, scandium, yttrium, lanthanoid series element, barium, strontium, or calcium.

16. The Schottky electron emission source of claim 15, wherein the emitter is single crystal tungsten for Schottky electron emission.

17. The Schottky electron emission source of claim 13, wherein the emitter is single crystal tungsten for cold or thermionic electron emission.

\* \* \* \* \*